METHOD OF MANUFACTURING THERMOELECTRIC DEVICES SUCH AS THERMOBATTERIES OR PELTIER REFRIGERATORS

Filed Sept. 20, 1961 2 Sheets-Sheet 1

INVENTOR
HANS J.GUSTAV MEYER
BY JAN VOLGER
AGENT

METHOD OF MANUFACTURING THERMOELECTRIC DEVICES SUCH AS THERMOBATTERIES OR PELTIER REFRIGERATORS

Filed Sept. 20, 1961 2 Sheets-Sheet 2

INVENTOR
HANS J. GUSTAV MEYER
JAN VOLGER
BY Frank R. Jifani
AGENT

United States Patent Office 3,209,433 Patented Oct. 5, 1965

3,209,433

METHOD OF MANUFACTURING THERMOELECTRIC DEVICES SUCH AS THERMOBATTERIES OR PELTIER REFRIGERATORS

Hans Joachim Gustav Meyer and Jan Volger, both of Emmasingel, Eindhoven, Netherlands, assignors to North American Philips Company, Inc., New York, N.Y., a corporation of Delaware Filed Sept. 20, 1961, Ser. No. 139,456
Claims priority, application Netherlands, Sept. 28, 1960, 256,344
13 Claims. (Cl. 29—155.5)

The invention relates to a method of manufacturing a thermoelectric device, such as a thermobattery or a Peltier refrigerator, comprising a series arrangement of elementary thermoelectric cells built up of one or more rows, in which beside each other and somewhat spaced from each other, a number of rods which alternately consist of the two thermoelectric materials destined for the elementary thermoelectric cell are provided between two conductive strips and the sandwich assembly thus formed is divided, by cutting at right angles to the longitudinal direction of the rods, into rows of rod segments connected together by parts of the strips.

By an elementary thermoelectric cell is normally understood an element which consists of two members being electrically conductive connected together and different thermoelectric properties (termed thermoelectric members), which element is destined to produce either a temperature difference or heat transport when electric current flows through this element, in which case the term Peltier element is used, or an electric voltage and/or current when a temperature difference is applied, in which case the term thermogenerator is used.

A thermoelectric cell, whether it is used as a thermogenerator or as a Peltier element, in general operates at comparatively low voltage and comparatively high current strength. For many uses, however, in particular in the case of large powers, a thermogenerator is desired to have a high voltage for connection to the commonly used consumption apparatus and, for the use of a Peltier refrigerator, often only a rather high supply voltage (mains voltage) is available. In order to avoid the adaption difficulties as much as possible, there is aimed at a thermoelectric device in the form of a series arrangement of elementary thermoelectric cells built up of one or more rows. In an embodiment commonly used for such a series arrangement, the elementary thermoelectric cell comprises a $\pi$-shaped element, the two parallel limbs of which form the thermoelectric members, which are shunted at the one side by an electrically conductive connecting member and at the other side each have such a connecting member which is destined for being connected to the thermoelectric cell preceding or succeeding in the series arrangement.

The mounting of such a series arrangement, however, is very difficult because often a large number of soldered joints have to be made between connecting members and thermoelectric members, in which, in addition, a large danger of exchanging exists and because in the ultimate form the connecting members, which form the warm or cold contact places, must accurately lie in a definite plane, for example a flat plane or a cylindrical plane, so as to ensure a regular thermal contact with the limiting plane of the heat dissipating or heat supplying member.

According to a method already proposed and mentioned above, rows of thermoelectric cells are manufactured from an assembly of parallel rods provided between conductive flat plates, by cutting this assembly at right angles to the longitudinal direction of the rods. In order to obtain an electric series arrangement of the thermoelectric cells in all the rows, the conductive plates in the assembly are cut throughout their length, before the transverse cutting, at the intermediate space between successive rods in the longitudinal direction, namely in successive intermediate spaces alternately one plate and the other. The conductive plates are each divided into mutually separated strips already before the transverse cutting. When assembling the thus obtained rows to a battery consisting of several rows, it is necessary for obtaining a satisfactory series arrangement of the rows to reverse the ends of every second row by turning the row through 180°. British Patent 811,755 describes this.

The object of the invention is to provide a particularly suitable and effective method which, as regards the manufacture of the rows themselves and in particular also as regards the manufacture of thermoelectric devices built up of several series-connected rows, offers considerable advantages with respect to the method already proposed and which in addition may advantageously be used for the manufacture of configurations other than flat configurations, for example a cylindrical or annular configuration.

Therefore, according to the invention, in the method mentioned above the conductive strips are provided with an alternating pattern of non-conductive parts which, in co-operation with the cuttings at right angles to the longitudinal direction in at least two successive rows of this assembly, interrupt the electric connection formed by the strip between successive rod segments at the intermediate spaces in the direction of the rows alternately in the one and in the other strip, whereas these non-conductive parts are shifted from one row to the other in intermediate spaces which are in alignment with each other from one strip to the other. The conductive strips preferably consist of self supporting conductive plates, for example copper or aluminum, and the non-conductive parts consist of cavities in these plates. However, it is also possible to construct the conductive strips in the form of layers on insulating carrier plates which may be provided in the commonly used manner and to provide the holes only in the conductive layer, for example by using a mask during the provision of the layer. In this case, the non-conductive parts may also be obtained by oxidising the layer locally, for example in the case of aluminum layer by converting it into aluminum oxide.

Because in the method according to the invention the non-conductive parts in the assembly in at least two successive rows are shifted each time from one strip to the other both in the direction of the rows and at right angles to this direction, each of the conductive strips or plates remains cohering mechanically in spite of the provision of this pattern. This involves a smaller mechanical attenuation than in the method already proposed, in which the plates are divided into sections separated from each other by entirely cutting in the longitudinal direction. In addition, this pattern is such that the cross-cutting is then simplified.

Preferably, the conductive strips are provided beforehand with the alternating pattern of non-conductive parts, after which the strips and the rods are united to the sandwich assembly and the cross-cutting is carried out. This preceding processing of the strips is also possible due to the mechanical coherence to be obtained in the alternating pattern. In particular when the cutting operation is carried out mechanically, for example by sawing or milling, this method offers the additional advantage that the assembly itself need undergo only the cross-cutting operation. In addition, providing beforehand of the cavities in the plates is a far simpler operation which may be carried out for example by punching or chemically or electro-chemically by using etching technologies. Within the scope of the invention, however, the alternating pattern may advantageously be provided in the assembly already formed, for example mechanically or in particular by means of chemical or electro-chemical etching technologies known per se, in which the parts of the strips to be maintained are covered beforehand with a masking layer. In this connection it may be recommendable sometimes, for the benefit of mechanical strengthening, to fill the spaces in the assembly with a hardening electrically and thermally insulating mass, such as for example an epoxy-resin known as "Araldite," before providing the pattern or carrying out the cross-cutting.

The method according to the invention may advantageously be applied to a flat assembly for the manufacture of flat rows. However, the invention is also particularly suitable for use in the manufacture of annular rows which, if desired, may be combined to form a Peltier refrigerator or thermogenerator of a cylindrical shape. For that purpose, according to the invention, the conductive strips are constructed as two concentric cylinder jackets between which the rods are attached in tangential direction beside each other with their axes parallel to the cylinder axes, while the cutting determining the rows is carried out in the direction at right angles to the cylinder axes. In this method also, use may advantageously be made of the possibility of providing in the strips the alternating pattern of non-conductive parts before the manufacture of the assembly, in which case the pre-processed cylinder jackets still form an assembly which simplifies the construction of the assembly.

Whereas the invention may advantageously be used for the manufacture of single rows of series-connected elementary thermoelectric cells, it has in addition appeared to be particularly effective for the manufacture of a thermoelectric device comprising several series-connected rows arranged behind each other. According to a further preferred embodiment of the invention, the rows for such a device are manufactured from an assembly of the already described shape by parallel cuttings at constant distance from each other. In this assembly, the conductive strips, at least in the area of the strips covered by these rows, the alternating pattern is provided in a manner such that it is repeated in each row in the direction of the rows and also across these rows in a direction at right angles to the direction of the rows. The series arrangement of the rows is preferably obtained by connecting each row in an electrically conductive manner in its arrangement present in the original assembly at the one extreme rod to the preceding row and at the other extreme rod to the next row in a manner such that the direction of current in successive rows is reversed each time. In addition to the advantages already mentioned which relate to the mechanical coherence of the strips after the provision of the pattern, the additional advantage occurs in this case that the rows may be arranged after each other in their arrangement present in the original assembly, as a result of which the possibility of exchanging and wrong connection or insertion is much smaller than in the method already proposed, in which the ends of each second row have to be reversed.

The electric connection between successive rows may be obtained by connecting the relative extreme rod segments by means of a conductive contact strip, for example by soldering a copper strip. According to a further preferred method, the electric connection between at least two successive rows is obtained in that in the cutting separating these rows, the assembly is not or only partially cut at the relative extreme rod. In the manufacture of a thermoelectric device composed of more than two rows, the series arrangement of the rows is preferably obtained in that in the successive cutting the assembly is not or only partially cut alternately at the one extreme rod and the other extreme rod. In this manner, the right series arrangement of the rows is automatically obtained, in which equal contact points, warm or cold, always occur in the same strip. When in the assembly more than two rods are used, the two adjacent rod segments, in the case of the extreme rods being not or only partially cut, together form a current passage of a larger cross-section than the rod segments situated more towards the centre. Since the current density in the rod segments is decisive of the extent of the thermoelectric effect, the current density in the extreme rod segments also preferably is kept equal to the current density in the other rod segments. For that purpose, according to a further preferred measure according to the invention, in this latter method the cross-section, in particular the width, of the two extreme rods of the assembly is chosen smaller than the cross-section and width respectively of the rods situated more towards the centre, namely so, that, dependent on the extent of cutting of the extreme rods, the current density in the extreme rod segments is substantially equal to that in the other rod segments. When the extreme rod would not be cut, the current density, in the case of equal cros-section of all the rods, would be half of that of the other rod segments. In the case of the extreme rods not being cut, the cross-section and width respectively of the extreme rods is consequently preferably chosen to be equal to half of the cross-section and width respectively of the other rods.

The above-mentioned measures for the manufacture of a thermoelectric device consisting of several series-connected rows are not only suitable to be applied to a flat assembly, but they may also advantageously be applied in an analogous manner to the above-indicated cylindrical assembly for the manufacture of annular rows which are combined to form a device of a cylindrical shape by connecting these rows after each other. In this case, the conductive strips are constructed as concentric cylinder jackets and the rods are provided in a tangential direction next to each other with their axes parallel to the cylinder axis between two concentric cylinder planes, while the cuttings determining the rows are carried out in a direction at right angles to the cylinder axis and shifted with respect to each other. Such a cylindrical configuration of the thermoelectric device may also be obtained, however, by applying the method according to the invention and, if desired, the above-indicated preferred measurements, to an assembly in which the conductive strips are constructed as concentric cylinders and the rods in the form of rings are provided between these cylinders, which rings are provided in the axial direction and shifted with respect to each other, while the cuttings determining the rows in the axial direction are carried out at right angles to the rings and tangentially shifted with respect to each other. In this case also, the alternating pattern of non-conductive parts preferably is present already in the cylinder planes before the manufacture of the assembly, in that sense that the direction of the rows now is parallel to the axial direction and the rows follow each other shifted tangentially with respect to each other.

When using the method according to the invention for the manufacture of a device having several rows, and in particular in a method in which the electric connection between successive rows is obtained in that the assembly, at the relative extreme rod, is not or only partially cut, the cross-cutting operation is preferably carried out in at least two stages with an intermediate operation in which the part of the assembly cut in the first stage is filled, for strengthening, with a thermally and electrically insulating hardening mass, for example "Araldite." This intermediate operation improves the mechanical consistency of the rows considerably in that it again connects parts which were separated before.

The invention further relates to the thermoelectric device manufactured by using the method according to the invention.

In order that the invention may readily be carried into effect, it will now be described, by way of example, with reference to the accompanying diagrammatic drawings, in which FIGURE 1 is a plan view of an arrangement of a number of rods consisting of thermoelectric material and used in the method according to the invention.

Figure 1:
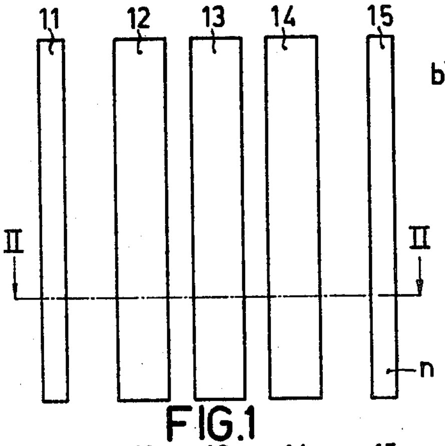
Figure 2:
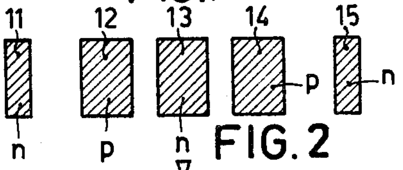
FIGURE 2 shows a cross-sectional view along the dotted line II—II shown in FIGURE 1.

When using the method according to the invention, a number of rods consisting of thermoelectric material is used as starting material. As thermoelectric material may for example be used semi-conductor materials, such as $Bi_2Te_3$, $Sb_2Te_3$, PbTe or other known thermoelectric metals, such as copper and constantan. These rods may be manufactured by sintering powder or via a remelting process, possibly combined with sawing. FIGURE 1 in plan view shows, by way of example, five rods, indicated by 11, 12, 13, 14 and 15 respectively in an arrangement which may be used afterwards in the sandwich assembly to be manufactured. FIGURE 2 shows the rods in a cross-section along the line II—II of FIGURE 1. These rods alternately consist of the two thermoelectric materials destined for the two thermoelectric members of the elementary thermoelectric cell. The rods 11, 13, 15 for example may consist of n-type semi-conductor material, for example n-type bismuth telluride, while the rods 12 and 14 may consist of p-type semi-conductor material, such as p-type bismuth telluride.

In this arrangement, the rods are connected between two conductive strips, in this case flat massive plates, for example consisting of copper, by soldering connections which connect the rods throughout their length with their surface facing the plates to the copper plates in an electrically conductive and mechanically rigid manner.

Figure 3:
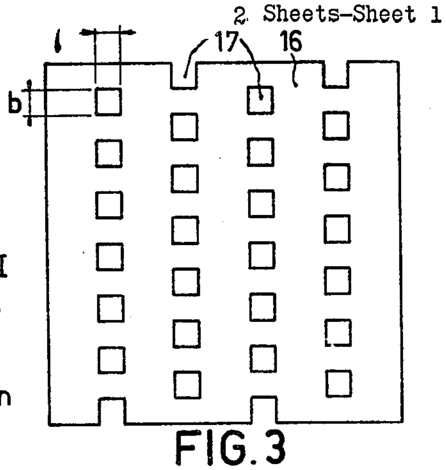
FIGURE 3 is a plan view of plate which is used in the method according to the invention.

FIGURE 3 is a plan view of the copper plate 16 to be used as upper plate. Before combining the plates and the rods to the sandwich assembly, the plates are provided with a pattern of non-conductive parts, in the present case with holes 17, for example by means of punching or chemically or electro-chemically by means of etching operations known per se, in which the parts not to be removed may be masked beforehand.

The pattern of the holes is chosen so that the holes in the assembly together with the cuttings to be applied interrupt in at least two successive rows the electric connection between successive rod segments in the direction of the rows alternately in the one plate and in the other plate, staggering from one row to the other row from one plate to the other plate. These holes 17 are provided in places which are used as intermediate spaces between the rods. Because the holes 17 are shifted from one row to the other row in intermediate spaces which are in alignment from one plate to the other, the upper plate 16 is mechanically cohering, which considerably simplifies the manufacture of the assembly between accurately determined planes, when this shifting takes place in at least two successive rows. In the upper plate shown in FIGURE 3, the pattern of holes is regularly provided in the whole plate in all the rows destined for the thermoelectric device. The associated bottom plate of the assembly may in this case be equal to the upper plate shown in FIGURE 3 with this difference that it is used in the assembly in an arrangement turned through 180° in the plane of the drawing.

Figure 4:
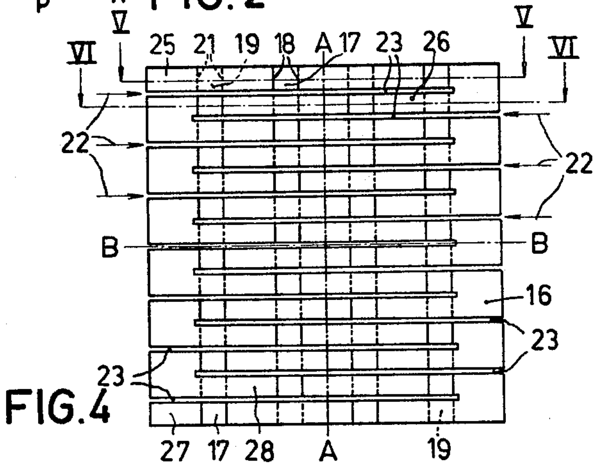
FIGURE 4 is a plan view of an assembly of plates and rods which is used in the method according to the invention.
Figure 5:
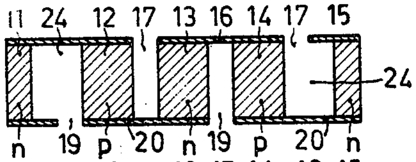
FIGURES 5 and 6 are longitudinal cross-sections of the assembly shown in FIGURE 4 along the dotted lines V—V and VI—VI respectively.
Figure 6:
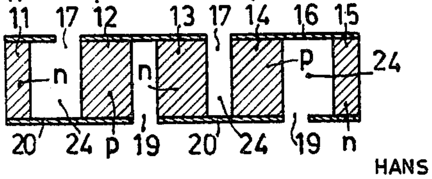

FIGURE 4 shows the assembly in plan view. FIGURE 5 is the cross-section of the assembly along the line V—V shown in FIGURE 4, and FIGURE 6 is a cross-sectional view of the assembly along the line VI—VI shown in FIGURE 4. In FIGURE 4, the holes 17 in the top plate 16 are indicated by solid lines 18 and the holes 19 in the bottom plate 20 by dotted lines 21. The cross-cuttings separating the rows which are indicated in FIGURE 4 by the arrows 22 are in this figure further indicated by the cuts 23. These cross-cuttings may be provided for example mechanically by sawing or milling. With a view to the mechanical rigidity of the assembly, it may be recommendable to perform the cutting operation in two stages, preferably in that sense that after providing the cuttings through the one strip, for example plate 16, and the whole or possibly partial cross-section of the rods 11, 12, 13, 14 and 15, the assembly is filled, at least the cut part, with a hardening insulating mass 24 which may also play a part as a thermal and electric insulation. Then the other strip is cut, in this case plate 20, and, if necessary, the possibly remaining part of the rods.

The width of the holes (indicated in FIGURE 3 by l) is chosen so that the holes (17 and 19) cover at least the distance between two successive cuttings, so that in co-operation with the cuttings, they interrupt the current path there. As appears from FIGURES 4, 5 and 6, the holes in the direction of the rows are provided alternately in the top plate 16 and in the bottom plate 20, so that the current path traverses each row zigzag. In at least two successive rows, for example the rows 25 and 26 of FIGURE 4 shown in cross-section in FIGURES 5 and 6, the holes are staggered in intermediate spaces which are in alignment from the one plate to the other plate. In the present example shown in FIGURE 3, this alternating pattern of the holes is repeated on the whole surface of the plates.

In order to combine the rows thus obtained to a device having several rows, in which all the cold contact places occur in the one plate and all the warm contact places in the other plate, the thus obtained rows may be arranged after each other in the arrangement occurring in the assembly without the extreme rod segments of every second row having to be reversed as was the case in the method already proposed before.

In order to effect the electric connection in successive rows, the particular possibility supplied by the invention to effect the electric connection between successive rows has already been used in the configuration shown in FIGURE 4 by not cutting the assembly at the extreme rod (for that purpose see for example the cutting 23 of the first two rows 25 and 26 which does not cut the extreme rod 15 and the parts of the plates 16 and 20 provided thereon). As appears from the following cuttings, these do not alternately cut the assembly at the extreme rods 11 and 15. As a result of this, the current will traverse the successive rows in opposite direction. By providing the alternating pattern of holes according to the invention, the consecutive rod segments will always be traversed in the same sequence also in the following rows. For example, assuming a direction of current from n-type rod segment 11 to p-type rod segment 12, each junction from a n-type rod segment to a p-type rod segment will be in the top plate and each junction from a p-type rod segment to a n-type rod segment will be in the bottom plate 20 in accordance with the requirement for satisfactory operation of a thermo-electric device that all equal contact places occur on the same side of the device. As appears from FIGURES 1, 2 and 5 and 6, the cross-section and the width of the two extreme rods 11 and 15 will be half of the cross-section and width respectively of the other rods 12, 13 and 14. This embodiment is preferably applied because at the junction from one row to the other, the extreme rod is not cut so that the extreme rod segment, which forms the connection between the successive rows in the direction at right angles to the direction of the rows has a dimension which is twice as large as that of the rod segments occurring in the row. By causing the width of the rod to be equal to half of the width of the other rods, the constant current density preferably desired in all the rod segments may be ensured all the same.

The electric connection between successive rows may, however, also be obtained by providing the cuttings 23 throughout the cross-section of the assembly and then connecting the extreme rod segments in question alternately at the one extreme rod and the other, for example by connecting in the rows shown in FIGURES 5 and 6 the parts of the plate 16 present on the extreme rod segments at the upper side or the parts of the plate 20 at the lower side by a conductive strip. When using this method, the cross-section of the extreme rods is chosen preferably equal to the cross-section of the other rods, because in this case the current traverses only one of the two extreme rod segments.

By using the method according to the invention, consequently a thermoelectric device is obtained built up in a simple manner from one or more rows and in particular it is possible in this manner to manufacture a thermoelectric device built up from one or several series-arranged rows as shown in FIGURE 4. In the device shown in FIGURE 4, the connecting pieces 27 and 25 of the top plate may be used as current supply members for the device.

After the cutting operation, the possibly remaining holes in the assembly may be filled with an insulating hardening mass.

The manufacture of a thermoelectric device having a flat configuration was described with reference to FIGURES 1–6. However, the invention is also suitable for the manufacture of thermoelectric devices shaped differently, for example, for the manufacture of annular rows of series-connected elementary thermoelectric cells or a cylindrical configuration built up from one or more rows.

Figure 7:
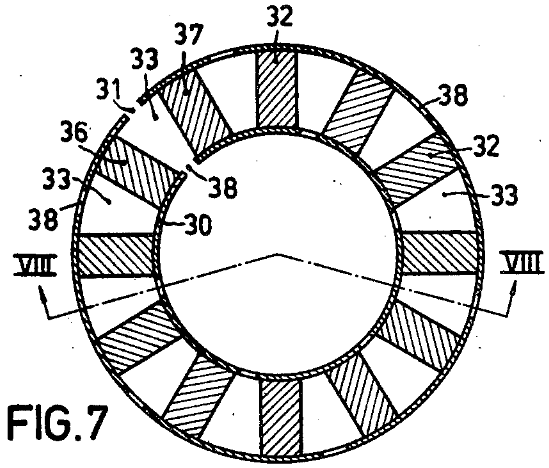
FIGURE 7 is a cross-section of the assembly of a cylindrical configuration as shown in FIGURE 8 along the the line VII—VII during the manufacture according to the invention.
Figure 8:
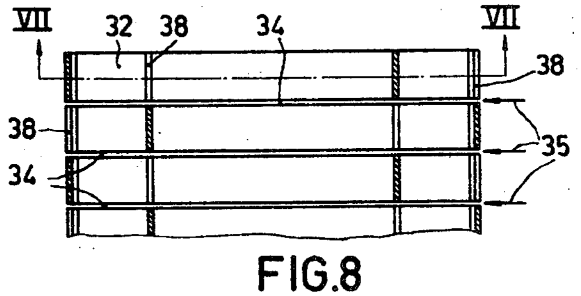
FIGURE 8 is a longitudinal cross-sectional view through the cylindrical assembly of FIGURE 7 along the line VIII—VIII shown in the figure.

FIGURE 7 shows an assembly of a cylindrical form in cross-section and FIGURE 8 shows a longitudinal sectional view through this assembly along the dotted line VIII—VIII shown in FIGURE 7. In this case, the conductive strips are constructed as cylinder jackets 30 and 31. The rods 32 are, in this case, connected between the cylinder jackets 30 and 31 in a tangential direction beside each other, separated by intermediate spaces 33, parallel to the axial direction of the cylinder. The cuttings are carried out in a plane at right angles to the axial direction and are indicated in FIG. 8 by arrows 35 and the cuttings 34. The assembly as shown in FIGURES 7 and 8 may be assumed to have been built up from a flat assembly of FIGURE 4 by shaping the assembly of FIGURE 4 around the axis A—A shown to a cylindrical configuration, the extreme rods 11 and 15 of a flat configuration, as that of FIGURES 4, coinciding with the extreme rods 36 and 37 of the cylindrical configuration shown in FIGURE 7. The method according to the invention as well as the particular embodiments thereof, may then be applied, while observing this relationship between the two configurations, in an analogous manner to the cylindrical configuration of FIGURES 7 and 8. In this case also, the plates may be provided beforehand with an analogous pattern of holes, for example already before they are bent to cylinder jackets. The pattern occurs in an analogous manner, in that sense that the direction of the rows now lies in a plane at right angles to the cylinder axis, namely in a tangential direction along the cylinder jacket. In the direction of the rows, the holes 38 are each time staggered in successive intermediate spaces between the rod segments from the one cylinder jacket 30 to the other cylinder jacket 31 and also in the consecutive rows the holes in the intermediate spaces which are in alignment are staggered between the rods from the one jacket to the other as may be seen from the cross section shown in FIGURE 8 for two intermediate spaces. The advantage of this staggering of the holes is that the jackets are mechanically cohering in spite of the presence of the holes. As a result of the cuttings 34 at right angles to the cylinder axis, annular rows of series-arranged elements may be manufactured in a simple manner. In addition, these rows may be combined in an analogous manner, if desired, and with analogous advantages as described with reference to FIGURE 4 to form a cylindrical device having several series-arranged rings.

Figures 9, 10:
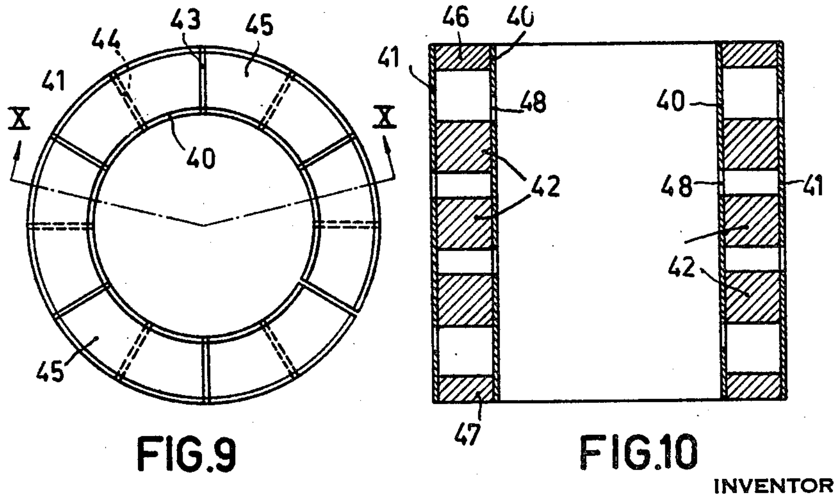
FIGURE 9 is a plan view of another cylindrical assembly during the manufacture according to the invention and FIGURE 10 is a longitudinal section view of the assembly shown in FIGURE 9 along the line X—X shown in this figure.

FIGURES 9 and 10 show still another assembly of a cylindrical shape. FIGURE 9 shows the cylinder in plan view and FIGURE 10 shows a longitudinal sectional view along the dotted line X—X shown in FIGURE 9. In this assembly, the conductive strips are also constructed as concentric cylinder jackets 40 and 41. However, in this case the rods are constructed in the form of rings 41 which are provided in the axial direction of the cylinder and shifted with respect to each other. The cutting is now carried out at right angles to the rods, that is to say in the axial direction, and the rows and the cutting now follow each other in a tangential direction and shifted with respect to each other. In FIGURE 9, these cuttings at right angles to the plane of the drawing are indicated by the reference numerals 43 and 44, between which the rows 45 occur. The assembly shown in FIGURES 9 and 10 may be assumed to be built up from a flat assembly, for example as that of FIG. 4, by shaping this assembly about the dotted line B—B shown in FIG. 4 to a cylindrical configuration, in which the extreme rods of the flat configuration would coincide with the extreme rings 46 and 47 of the cylindrical configuration of FIGURE 10. The method according to the invention, and the particular embodiments thereof, may then be used in an analogous manner while observing this relationship between the two configurations. For example, in the configurations shown in FIGURES 9 and 10, the electric connection between the rods following each other in a tangential direction may also be obtained by constructing the cross-cutting alternately only as far as the one extreme ring and as far as the other extreme ring. In FIGURE 9, the cuttings 43 extending only as far as the lower ring, are indicated by solid lines and the cuttings 44 extending only as far as the upper ring, are indicated by dotted lines. As appears from FIGURE 10, the holes 18 are provided so that they are staggered each time in the direction of the rows from one cylinder jacket 40 to the other cylinder jacket 41, while they are also staggered in consecutive rows in intermediate spaces which are in alignment from one jacket to the other.

Finally it is noted that naturally the invention is not restricted to the examples given. Within the scope of the invention many variations are possible. For example, the method according to the invention, as well as the particular embodiments thereof, may be applied in an analogous manner and with the same advantages in the use of an even number of rods, although in FIG. 4 an odd number of rods was used by way of example. In addition, in the example according to FIGURE 4, the cross dimension of the holes (in FIGURE 3 indicated by 1) was chosen substantially equal to the distance between successive rods so as to simplify the cross-cutting as much as possible. Alternatively, it is naturally also possible to choose this dimension smaller or larger in one or both plates so that the desired interruption is retained and the connection with other adjacent rod segments is not interrupted. For strengthening, for example in the configuration according to FIGURE 4, the plates 16 and 20 may project outside the rods through some distance. Although the alternating pattern of holes is preferably provided in the plate beforehand, it is of course also possible to provide them after the manufacture of the assembly which may be carried out for example in a simple manner chemically or electro-chemically by means of etching. Finally it is noted that the expression "rod" as it is used in the present application should be understood in a wide sense and consequently also comprises strip-shaped members or members, the largest dimension of the cross-section of which would be larger than the length, so long as this length is still sufficiently large to subdivide it into rod segments of a smaller length.

What is claimed is:

1. A method of manufacturing a thermoelectric device, comprising forming an assembly by securing between, and connecting to, a pair of conductive members a plurality of spaced elongated thermoelectric members alternating in conductivity type, said conductive members containing an array of non-conductive portions arranged in columns extending generally parallel to the elongated thermoelectric members, the non-conductive portions in one column of one conducting member being staggered relative to those in the adjacent column and relative to those in the corresponding column of the other conductive member, cutting the assembly through both conductive members substantially along a series of spaced planes transverse to the elongated thermoelectric members forming plural rows of alternately-arranged opposite conductivity type thermoelectric elements connected together by portions of the conductive members, the transverse cuts formed by the cutting step being related to the arrays of non-conductive portions to connect together in series arrangement all of the thermoelectric elements in each row.

2. A method as set forth in claim 1 wherein the conductive members form concentric generally cylindrical members with a common central axis, the elongated thermoelectric members constitute straight rods extending axially between the cylindrical members, and the planes along which the cutting step is made extend transverse to the said axis.

3. A method as set forth in claim 1 wherein the conductive members form concentric generally cylindrical members with a common central axis, the elongated thermoelectric members constitute annular members axially spaced from one another between the cylindrical members, and the planes along which the cutting step is made extend generally radially parallel to the said axis.

4. A method of manufacturing a thermoelectric device, comprising providing a pair of conductive plates with an array of non-conductive portions arranged in spaced columns with the non-conductive portions in one column of one conducting member being staggered relative to those in the adjacent column and relative to those in the corresponding column of the other conductive member, forming an assembly by securing between, and connecting to, said pair of conductive plates a plurality of spaced elongated thermoelectric rods alternating in conductivity type and arranged generally parallel to and between the columns of non-conductive portions, thereafter cutting the assembly through both conductive members substantially along a series of spaced planes transverse to the elongated thermoelectric members forming plural rows of alternately-arranged opposite conductivity type thermoelectric elements connected together by portions of the conductive members, the transverse cuts formed by the cutting step intersecting adjacent edges of the non-conductive portions in adjacent columns to connect together in series arrangement all of the thermoelectric elements in each row.

5. A method as set forth in claim 4 wherein, before the cutting step, the assembly is filled with a hardened insulating mass.

6. A method as set forth in claim 4 wherein the rows of elements are electrically connected in series by interconnecting the end element of one row to the adjacent end element in the row above, and by interconnecting the opposite end element in said one row to the adjacent element in the row below.

7. A method of manufacturing a thermoelectric device, comprising providing a pair of conductive plates containing an array of spaced non-conductive portions arranged in generally parallel columns, the non-conductive portions in one column of one conducting plate being staggered relative to those in the adjacent column and relative to those in the corresponding column of the other conductive plate, forming an assembly by securing between, and connecting to, the conductive plates arranged one above the other with their columns of non-conductive portions arranged one above the other a plurality of spaced elongated thermoelectric rods alternating in conductivity type and contacting portions of the conductive plates between the columns of non-conductive portions and arranged generally parallel thereto, and cutting the assembly through both conductive plates substantially along a series of spaced planes transverse to the elongated thermoelectric rods forming a plurality of transverse slots intercepting a non-conductive portion in each of the columns in both plates and extending completely through the assembly except for one extreme rod in alternate slots and the opposite extreme rod in the intermediate slots, forming plural rows of alternately-arranged opposite conductivity type thermoelectric elements all connected in series arrangement by the slots and non-conductive portions interrupting the conductive connections in each row between adjacent rods alternately in the top and bottom plates.

8. A method as set forth in claim 7 wherein the transverse slots are cut alternately from opposite sides of the assembly.

9. A method as set forth in claim 8 wherein after some only of the transverse slots have been cut, the assembly is filled with a hardened insulating mass.

10. A method as set forth in claim 7 wherein the extreme rods have approximately one-half the cross-sectional area of the intermediate rods.

11. A method as set forth in claim 7 wherein first the top plate is cut through, and afterwards the bottom plate is cut through.

12. A method as set forth in claim 7, wherein the plates are flat, the rods are straight, and the non-conductive parts are apertures in the plates.

13. A method as set forth in claim 7 wherein the cutting step is a mechanical cutting operation.

References Cited by the Examiner

FOREIGN PATENTS 811,755 4/59 Great Britain.
824,347 11/59 Great Britain.

JOHN H. MACK, *Primary Examiner.*

UNITED STATES PATENT OFFICE
CERTIFICATE OF CORRECTION

Patent No. 3,209,433

October 5, 1965

Hans Joachim Gustav Meyer et al.

It is hereby certified that error appears in the above numbered patent requiring correction and that the said Letters Patent should read as corrected below.

Column 1, line 27, after "and" insert -- having --; colum 2, line 42, after "by" insert -- entirely --; line 43, after "of" insert -- an --; column 4, line 20, for "cros-section" read -- cross-section --.

Signed and sealed this 17th day of May 1966.

(SEAL)
Attest:

ERNEST W. SWIDER
Attesting Officer

EDWARD J. BRENNER
Commissioner of Patents